(12) United States Patent
Goller et al.

(10) Patent No.: US 10,439,062 B2
(45) Date of Patent: Oct. 8, 2019

(54) METALLIZATION LAYERS FOR SEMICONDUCTOR DEVICES AND METHODS OF FORMING THEREOF

(71) Applicant: Infineon Technologies AG, Neubiberg (DE)

(72) Inventors: Bernhard Goller, Villach (AT); Kurt Matoy, Strau (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/261,566

(22) Filed: Sep. 9, 2016

(65) Prior Publication Data

US 2018/0076321 A1    Mar. 15, 2018

(51) Int. Cl.

| | |
|---|---|
| *H01L 29/78* | (2006.01) |
| *H01L 21/306* | (2006.01) |
| *H01L 21/308* | (2006.01) |
| *H01L 21/768* | (2006.01) |
| *H01L 29/417* | (2006.01) |
| *H01L 29/423* | (2006.01) |

(Continued)

(52) U.S. Cl.
CPC ........ *H01L 29/7827* (2013.01); *H01L 21/308* (2013.01); *H01L 21/30604* (2013.01); *H01L 21/30612* (2013.01); *H01L 21/743* (2013.01); *H01L 21/76841* (2013.01); *H01L 29/34* (2013.01); *H01L 29/401* (2013.01); *H01L 29/41741* (2013.01); *H01L 29/4236* (2013.01); *H01L 29/66666* (2013.01); *H01L 29/7802* (2013.01); *H01L 29/7813* (2013.01); *H01L 29/8611* (2013.01)

(58) Field of Classification Search
CPC ............. H01L 29/401; H01L 29/41741; H01L 29/41766; H01L 21/048; H01L 21/0485; H01L 21/0495; H01L 21/30604–30621; H01L 21/308–3088; H01L 21/2855; H01L 31/02366; H01L 33/22; H01L 33/38; H01L 33/382; H01L 14/021; C23C 14/00

See application file for complete search history.

(56) References Cited

U.S. PATENT DOCUMENTS 5,665,996 A * 9/1997 Williams ............ H01L 23/4824
257/401
2008/0038932 A1 * 2/2008 Wagner .................. C09K 13/08
438/753

(Continued)

*Primary Examiner* — William F Kraig
*Assistant Examiner* — Khatib A Rahman
(74) *Attorney, Agent, or Firm* — Slater Matsil, LLP

(57) ABSTRACT

A method of fabricating a semiconductor device includes etching a first surface of a semiconductor substrate from a first side using a first etching process to expose a second surface. The second surface includes a first plurality of features. The first plurality of features has an average height that is a first height. The second surface of the semiconductor substrate is etched from the first side using a second etching process to expose a third surface of the semiconductor substrate. The second etching process converts the first plurality of features into a second plurality of features. The second plurality of features has an average height that is a second height. The second height is less than the first height. A conductive layer is formed over the third surface of the semiconductor substrate using a physical deposition process.

24 Claims, 15 Drawing Sheets

(51) Int. Cl.
*H01L 29/66* (2006.01)
*H01L 29/34* (2006.01)
*H01L 29/40* (2006.01)
*H01L 29/861* (2006.01)
*H01L 21/74* (2006.01)

(56) References Cited

U.S. PATENT DOCUMENTS

| | | | |
|---|---|---|---|
| 2009/0194234 A1* | 8/2009 | Arai | H01L 21/67051 |
| | | | 156/345.23 |
| 2010/0116332 A1* | 5/2010 | Counil | H01L 31/0236 |
| | | | 136/256 |
| 2015/0024556 A1* | 1/2015 | Miyazaki | H01L 29/32 |
| | | | 438/138 |
| 2016/0225874 A1* | 8/2016 | Yoshinari | H01L 29/36 |
| 2016/0233129 A1* | 8/2016 | Hwang | B28D 5/04 |

* cited by examiner

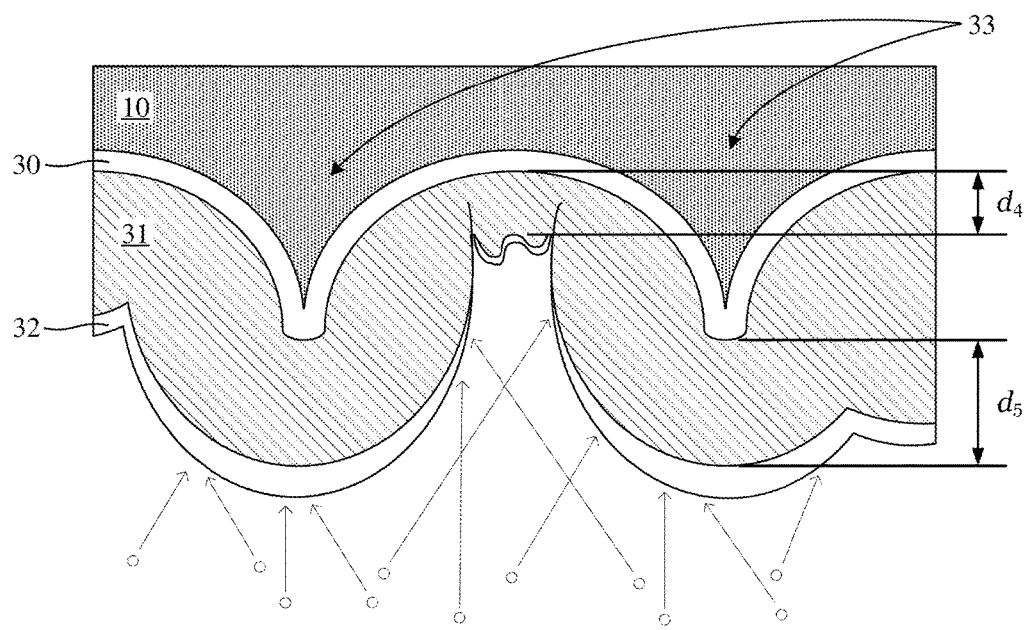
*Figure 4H1*
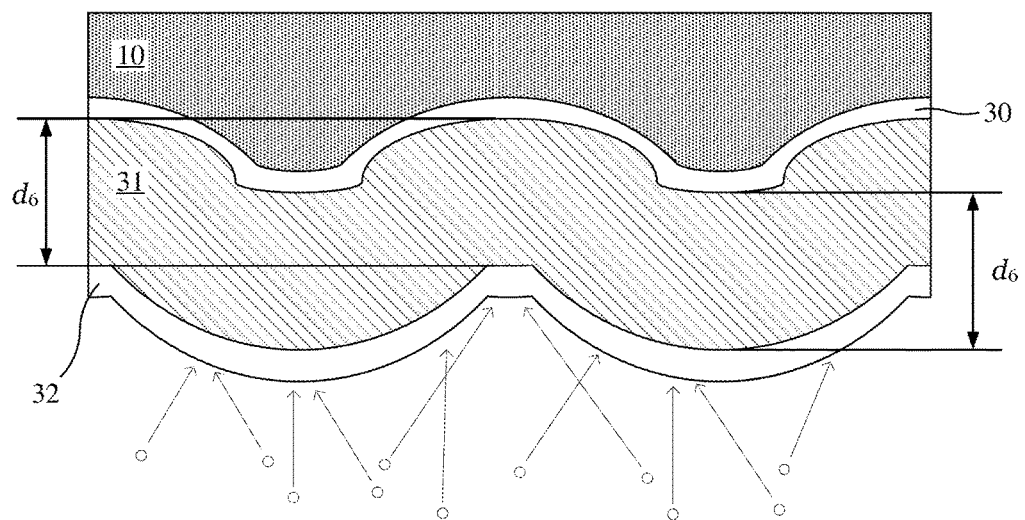
*Figure 4H2*

METALLIZATION LAYERS FOR SEMICONDUCTOR DEVICES AND METHODS OF FORMING THEREOF

TECHNICAL FIELD

The present invention relates generally to semiconductor processes and devices, and, in particular embodiments, to metallization layers for semiconductor devices and methods of forming thereof.

BACKGROUND

Backside metallization techniques are used in the field of semiconductor processing for a variety of devices such as microprocessors, laser diodes and other optical devices, power devices, radio frequency devices, and microwave devices. Backside metallization regions may provide heat dissipation pathways, mechanical stability, and bond the die to the package. Die bonding is often achieved by using the backside metallization regions as solder contacts or as contacts to under bump metallization structures. In addition to acting as a thermal interface and bonding the die to the packaging, backside metallization regions may also interface with the internal circuitry of the device by connecting to redistribution layers and through-silicon vias. Such connections may act as an electrical interface between the die and the packaging.

SUMMARY

In accordance with an embodiment of the invention, a method of fabricating a semiconductor device includes etching a first surface of a semiconductor substrate from a first side using a first etching process to expose a second surface. The second surface includes a first plurality of features. The first plurality of features has an average height that is a first height. The second surface of the semiconductor substrate is etched from the first side using a second etching process to expose a third surface of the semiconductor substrate. The second etching process converts the first plurality of features into a second plurality of features. The second plurality of features has an average height that is a second height. The second height is less than the first height. A conductive layer is formed over the third surface of the semiconductor substrate using a physical deposition process.

In accordance with an embodiment of the invention, a method of fabricating a semiconductor device includes etching a first surface of a semiconductor surface from a first side using a first etching process in an etching tool to expose a second surface of the semiconductor substrate. The first etching process includes a first set of etchants. The second surface of the semiconductor substrate is etched from the first side using a second etching process in the etching tool to expose a third surface of the semiconductor substrate. The second etching process may include the first set of etchants and phosphoric acid. A conductive layer is formed over the third surface of the semiconductor substrate using a physical deposition process.

In accordance with another embodiment of the invention, a semiconductor device includes an epitaxial region disposed in or over a first side of a semiconductor substrate. A well region is disposed in the epitaxial region. A conductive layer is disposed over a surface of the semiconductor substrate. The surface is on a second side of the semiconductor substrate. The surface includes a plurality of features. The plurality of features include a height and a width and are spaced from each other by a pitch. A ratio of the height to the width is between 0.2 and 0.5 and a ratio of the width to the pitch is between 0.5 and 1.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A-4H illustrate an embodiment of forming a substrate comprising a rough surface and a material layer formed over the rough surface in accordance with an embodiment of the present invention, wherein FIG. 4A illustrates a cross-sectional view of a substrate after forming a device region over the substrate, wherein FIG. 4B illustrates a cross-sectional view of the substrate after forming a passivation layer over the device region, wherein FIG. 4C illustrates a cross-sectional view of the substrate after thinning the substrate, wherein FIG. 4D illustrates a cross-sectional view of the substrate after etching the substrate to form a rough surface of the substrate with sharp features, wherein FIG. 4E illustrates a cross-sectional view of the substrate after etching the substrate to controllably smooth the rough surface of the substrate, wherein FIG. 4F illustrates a cross-sectional view of the substrate after forming an adhesion layer over the rough surface of the substrate, wherein FIG. 4G illustrates a cross-sectional view of the substrate after forming a thick material layer over the adhesion layer, and wherein FIG. 4H illustrates a cross-sectional view of the substrate after forming a thin material layer over the thick material layer;

FIGS. 4H1 and 4H2 illustrate a magnified cross-sectional view of a substrate, an adhesion layer, a thick material layer, and a thin material layer, wherein FIG. 4H1 illustrates a substrate with sharp features, and wherein FIG. 4H2 illustrates a substrate with smoothed sharp features;

FIGS. 5A-5G illustrate an embodiment of forming buried structures on a substrate comprising one or more recessed regions each comprising a rough surface and a material layer formed over the rough surface in accordance with an embodiment of the present invention, wherein FIG. 5A illustrates a cross-sectional view of a substrate after forming a device region over the substrate, wherein FIG. 5B illustrates a cross-sectional view of the substrate after forming a mask over select areas of the device region, wherein FIG. 5C illustrates a cross-sectional view of the substrate after forming one or more recessed regions in the device region, wherein FIG. 5D illustrates a cross-sectional view of the substrate after etching surfaces of the recessed regions to form rough surfaces with sharp features, wherein FIG. 5E illustrates a cross-sectional view of the substrate after etching the surfaces to controllably smooth the rough surfaces of the recessed regions, wherein FIG. 5F illustrates a cross-sectional view of the substrate after forming adhesion layers, thick material layers, and thin material layers over the rough surfaces of the recessed regions, and wherein FIG. 5G illustrates a cross-sectional view of the substrate after forming a capping layer over the thin material layer of each recessed region and the device region; and FIGS. 6A-6F illustrate an embodiment of forming recessed structures on a substrate comprising one or more recessed regions each comprising rough surfaces and a material layer formed over the rough surfaces in accordance with an embodiment of the present invention, wherein FIG. 6A illustrates a cross-sectional view of a substrate after forming a device region over the substrate, wherein FIG. 6B illustrates a cross-sectional view of the substrate after forming a mask over select areas in the device region, wherein FIG. 6C illustrates a cross-sectional view of the substrate after forming one or more recessed regions in the device region, wherein FIG. 6D illustrates a cross-sectional view of the substrate after etching surfaces of the recessed regions to form rough surfaces with sharp features, wherein FIG. 6E illustrates a cross-sectional view of the substrate after etching surfaces to controllably smooth the rough surfaces of the recessed regions, and wherein FIG. 6F illustrates a cross-sectional view of the substrate after forming adhesion layers, thick material layers, and thin materials layers over the adhesion layer of each recessed region.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

The formation of a thin material layer over a thick material layer is a common occurrence in semiconductor processing. However, forming a thick material layer on a rough substrate can magnify the topography of the substrate resulting in greater height variation of the surface of the thick material layer than the original rough surface of the substrate. This may lead to problems such as self-shadowing when surface roughness during material layer deposition gets too high. All subsequent, e.g. PVD, deposited layers will be affected by self-shadowing. Self-shadowing occurs when a large feature on the surface shields the incident flux of the material being deposited from reaching the surface.

The thickness of the deposited material layers may be non-uniform due to self-shadowing. In some cases, self-shadowing may lead to local thinning of the deposited material layers, reducing the performance of the material layer.

In conventional processes, the surface of the underlying substrate is smoothed to improve the uniformity of subsequent layers that are formed. However, smooth interfaces have adhesion issues and may not have sufficiently low contact resistance. Additional process steps and material layers may be necessary to overcome these issues. For example, implantation steps and harsh annealing steps might be necessary. This adds further time and complexity to the fabrication process and in some cases may be infeasible due to incompatibility of the harsh annealing steps with other structures and processes.

According to various embodiments, the present invention discloses various methods of forming material layers on a rough substrate. The following description describes the various embodiments. Various embodiments for devices utilizing material layers formed on a rough substrate are described using FIGS. 1-3. Several embodiment methods for forming material layers on rough surfaces are described using FIGS. 4-6.

Figure 1:
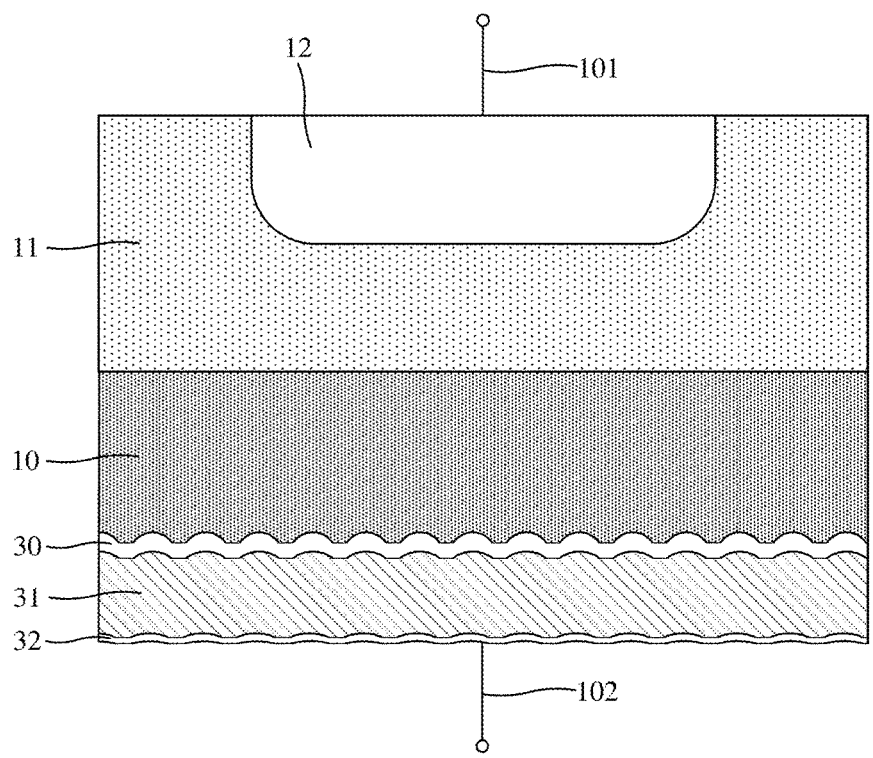
FIG. 1 illustrates a cross-sectional view of a semiconductor device having a rough substrate and a material layer formed over the substrate in accordance with an embodiment of the present invention.
Figure 2:
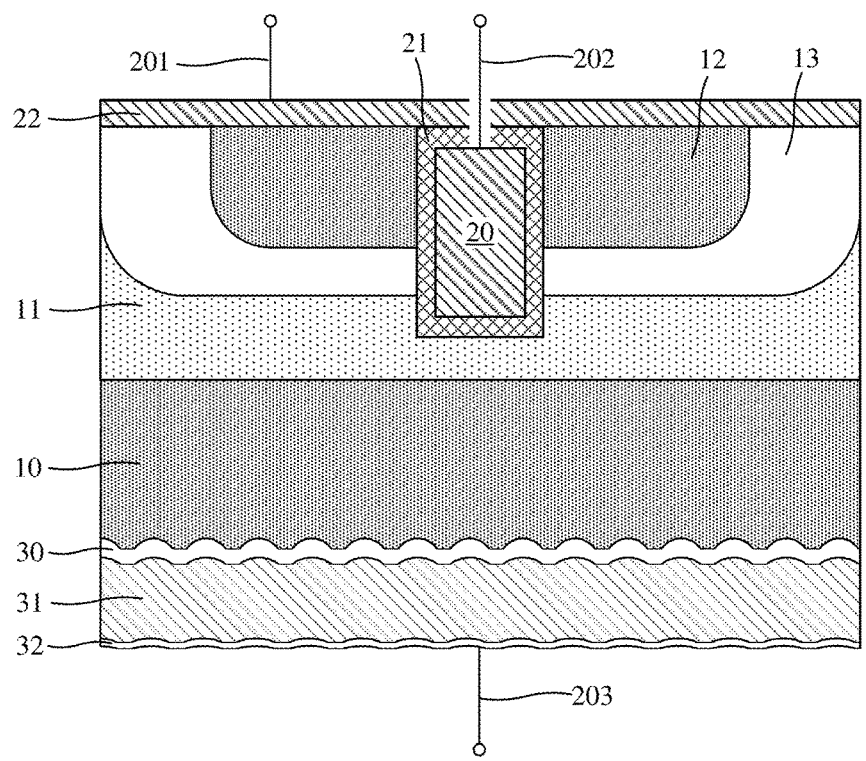
FIG. 2 illustrates a cross-sectional view of an alternative embodiment of a semiconductor device having a rough substrate and a material layer formed over the substrate.
Figure 3:
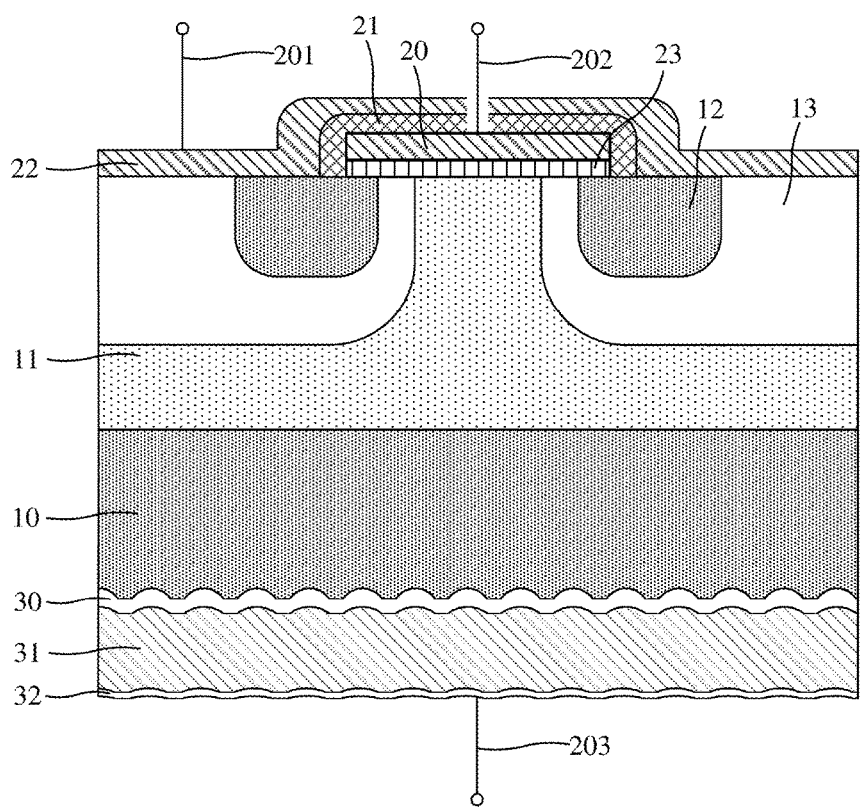
FIG. 3 illustrates a cross-sectional view of another alternative embodiment of a semiconductor device having a rough substrate and a material layer formed over the substrate.

FIGS. 1-3 illustrate semiconductor devices having a rough substrate and a material layer formed over the substrate in accordance with embodiments of the present invention. Additional details of each structure will be explained after first describing the common features.

According to the embodiments of the present invention, the semiconductor device may include active devices as well as passive devices. The semiconductor device may be a power semiconductor device. Examples of power semiconductor devices include discrete PN diodes, Schottky diodes, junction gate field-effect transistors (JFETs), metal-oxide-semiconductor field-effect transistors (MOSFETs), bipolar junction transistors (BJTs), insulated-gate bipolar transistors (IGBTs), depletion enhancement MOSFETs, lateral double-diffused MOSFETs (LDMOSFETs), and others. The power semiconductor device may be a wide-bandgap semiconductor device such as a silicon carbide device and a gallium nitride device.

Referring to FIGS. 1-3, the semiconductor devices include a substrate 10, an adhesion layer 30, a thick material layer 31, and a thin material layer 32. The substrate 10 has at least one rough surface. In various embodiments, the sharp features in the topography of the rough surface of the substrate 10 have been removed to facilitate uniformity in subsequent material layers as described below in reference to FIGS. 4-6.

In various embodiments the substrate 10 may be a semiconductor substrate. In various embodiments, the substrate 10 may be a silicon substrate, germanium substrate or may be a compound semiconductor substrate including indium antimonide (InSb), indium arsenide (InAs), indium phosphide (InP), gallium nitride (GaN), gallium antimonide (GaSb), gallium arsenide (GaAs), silicon carbide (SiC), or combinations thereof. In various embodiments, the substrate 10 is a silicon substrate and highly doped, in one embodiment. The highly doped substrate may have a dopant concentration between $5 \times 10^{16}$ cm$^{-3}$ to $5 \times 10^{18}$ cm$^{-3}$, and about $10^{18}$ cm$^{-3}$ or higher in one embodiment. In one embodiment, the substrate 10 is a silicon wafer that is formed with an initial doping type. In one embodiment, the substrate 10 is a silicon wafer that is nearly undoped. In an alternative embodiment, the substrate 10 is a silicon wafer that is doped using diffusion. For example, a doped layer is deposited over the undoped substrate and the substrate annealed so as to diffuse the dopants from the doped layer into the undoped substrate.

The adhesion layer 30, thick material layer 31, and thin material layer 32 are arranged in order over the rough surface of the substrate 10 that has had the sharp features removed. In various embodiments, the adhesion layer 30, the thick material layer 31, and the thin material layer 32 form a back side metallization layer stack for the semiconductor device. The adhesion layer 30 may form strong bonds with the substrate 10 and the thick material layer 31. Accordingly, the material of the adhesion layer 30 depends on the materials chosen for the substrate 10 and the thick material layer 31. The adhesion layer 30 may also serve as a barrier to diffusion. In various embodiments, the adhesion layer 30 comprises one or more of aluminium (Al), titanium (Ti), chromium (Cr), nickel (Ni), and tungsten (W). In one embodiment, the adhesion layer 30 is titanium. In various embodiments, the adhesion layer 30 is optional.

The thick material layer 31 is formed over the adhesion layer 30 or directly on the substrate 10 if the adhesion layer 30 is excluded. The thick material layer 31 may function as an electrically conductive and/or thermally conductive layer and therefore materials with low electrical resistance and/or thermal resistance that are also compatible with the subsequent processing may be selected. In various embodiments, the thickness of the thick material layer 31 is between 500 nm and 5 μm. In one embodiment, the thickness of the thick material layer 31 is 1 μm. In various embodiments, the thick material layer 31 comprises one or more of titanium (Ti), chromium (Cr), molybdenum (Mo), Tantalum (Ta), palladium (Pd), zinc (Zn) aluminium (Al), copper (Cu), silver (Ag), gold (Au), nickel (Ni), palladium (Pd), platinum (Pt), tin (Sn), vanadium (V), hafnium (Hf), tungsten (W), and lead (Pb) and alloys thereof. In one embodiment, the thick material layer 31 is a nickel vanadium (NiV) alloy.

The thin material layer 32 is formed over the thick material layer 31 and is thin relative to the thick material layer 31. The thin material layer 32 may be used as a solderable metallization or as a novel surface finish in order to protect the thick material layer 31 from oxidation. In various embodiments, the thin material layer 32 is between 100 nm and 500 nm. In one embodiment, the thickness of the thin material layer 32 is about 200 nm. The thin material layer comprises one or more of silver (Ag), gold (Au), and palladium (Pd) in various embodiments. In some embodiments, the thin material layer 32 is a gold alloy such as gold tin (AuSn), for example. In one embodiment, the thin material layer 32 is silver (Ag).

In various embodiments, the adhesion layer 30, thick material layer 31, and thin material layer 32 form a conductive stack. Example conductive stacks include Ti/Ni/Au, Ti/NiV/Ag, Ti/Ni/Au, TiW/Pd/Au, and Cr/Ni/Au, but many other combinations are possible.

FIG. 1 illustrates a cross-sectional view of a diode device.

Referring to FIG. 1, the diode device includes an epitaxial layer 11 on the substrate 10. The epitaxial layer 11 is formed on the substrate 10 using a vapor phase epitaxy process in one embodiment. In an alternative embodiment, the epitaxial layer 11 is grown using a liquid phase epitaxy process.

The epitaxial layer 11 may be the same material as the substrate or a different material than the substrate. In one embodiment, the epitaxial layer 11 has the same doping type as the substrate 10. In various embodiments, the epitaxial layer 11 is silicon and is lightly doped relative to the substrate 10 in one embodiment. The lightly doped epitaxial layer may have a dopant concentration of about $10^{14}$ cm$^{-3}$ in silicon.

A well region 12 is formed within the epitaxial layer 11. In one embodiment, the well region 12 is highly doped. The well region 12 may be formed using an ion implantation process or a diffusive process, for example. In one embodiment, the well region 12 and the epitaxial layer 11 have opposite doping types that form a p-n junction at the interface of the well region 12 and the epitaxial layer 11.

Still referring to FIG. 1, the diode device further includes a first connection 101 coupled to the well region 12 and a second connection 102 coupled to the thin material layer 32. Electrical connection may be made to the diode device through the first connection 101 and the second connection 102. In one embodiment, the well region 12 and the substrate 10 are doped such that the first connection 101 and the second connection 102 make good ohmic contact with the well region 12 and the substrate 10 respectively and the diode device is a power diode device. In an alternative embodiment, the well region 12 is omitted and the first connection 101 forms a Schottky barrier with the epitaxial layer 11 and the diode device is a Schottky diode.

FIG. 2 illustrates a cross-sectional view of a trench gate metal-oxide-semiconductor field-effect transistor (MOSFET) device.

Referring to FIG. 2, the trench gate MOSFET device includes a well region 12, a deep well region 13, and an epitaxial layer 11 on the substrate 10. The epitaxial layer 11 is formed on substrate 10 as previously described. The deep well region 13 is disposed in the epitaxial layer 11. The deep well region 13 may be formed using an ion implantation process, a diffusive process, and others. The well region 12 is disposed in the deep well region 13 and may be formed as previously described. In one embodiment, the deep well region 13 has the opposite doping type as the epitaxial layer 11. In one embodiment, the well region 12 has the opposite doping type as the deep well region 13 and the same doping type as the epitaxial layer 11.

A gate material 20 is disposed in the well region 12 and the deep well region 13 and a conductive material 22 is disposed over the epitaxial layer 11, well region 12, and deep well region 13. The well region 12, deep well region 13, and conductive material 22 are separated from the gate material 20 by an insulating material 21. The conductive material 22 is formed such that there is good ohmic contact between the conductive material 22 and the well region 12.

Still referring to FIG. 2, the trench gate MOSFET also includes a source connection 201, gate connection 202, and drain connection 203. The source connection 201 is electrically coupled to the conductive material 22. The gate connection 202 is electrically coupled to the gate material 20. The drain connection 203 is electrically coupled to the thin material layer 32.

In one embodiment, the substrate 10 and the epitaxial layer 11 have the same doping type and the device is a trench gate MOSFET device. In an alternative embodiment, the substrate 10 and the epitaxial layer 11 have opposite doping types and the device is a trench gate insulated-gate bipolar transistor (IGBT) device. The trench gate MOSFET device and the IGBT device may be power semiconductor devices.

FIG. 3 illustrates a cross-sectional view of a planar metal-oxide-semiconductor field-effect transistor (MOSFET) device.

Referring to FIG. 3, the planar MOSFET device includes a source connection 201, gate connection 202, and drain connection 203 electrically coupled to a conductive material 22, a gate dielectric layer 23, a gate material 20, and a thin material layer 32 as previously described. In some embodiments, the gate dielectric layer 23 and the insulating material 21 are different materials and in other embodiments the gate dielectric layer 23 and the insulating material 21 are the same material. The planar MOSFET device further includes well regions 12, deep well regions 13, and an epitaxial layer 11 on the substrate 10. In contrast to the trench MOSFET device illustrated in FIG. 2, the gate material 20 of the planar MOSFET device is disposed over the deep well regions 13, well regions 12, and the epitaxial layer 11. An insulating material 21 and a gate dielectric layer 23 separate the gate material 20 from the conductive material 22, deep well regions 13, well regions 12, and the epitaxial layer 11.

Similar to previous embodiments, the substrate 10 and the epitaxial layer 11 have the same doping type and the device is a MOSFET device in one embodiment. In an alternative embodiment, the substrate 10 and the epitaxial layer 11 have opposite doping types and the device is an insulated-gate bipolar transistor (IGBT) device. The MOSFET device and the IGBT device may be power semiconductor devices. For example, in one or more embodiments, the above mentioned devices may be a planar device or a vertical device having a drain electrode on the opposite side of a source electrode.

FIGS. 4A-4H illustrate an embodiment of forming a substrate comprising a rough surface and a material layer formed over the rough surface in accordance with an embodiment of the present invention.

Figure 4A:
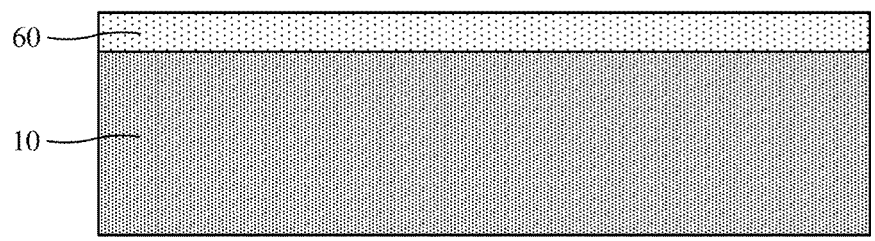

FIG. 4A illustrates a cross-sectional view of a substrate after forming a device region over the substrate in accordance with embodiments of the present invention.

Referring to FIG. 4A, a device region 60 is formed over a substrate 10. As described previously, the substrate 10 may be a semiconductor substrate in various embodiments. The substrate 10 may be a silicon substrate, germanium substrate or may be a compound semiconductor substrate including indium antimonide (InSb), indium arsenide (InAs), indium phosphide (InP), gallium nitride (GaN), gallium antimonide (GaSb), gallium arsenide (GaAs), silicon carbide (SiC), or combinations thereof. In various embodiments, the substrate 10 is a silicon substrate.

The device region 60 may include various additional doped regions, contacts, passivation layers, and metallization layers which may be formed using known fabrication techniques in accordance with specific device requirements for the formation of devices in the device region 60. Such fabrication techniques include, but are not limited to patterning, deposition, annealing, implantation, diffusion, material removal, and cleaning techniques.

Figure 4B:
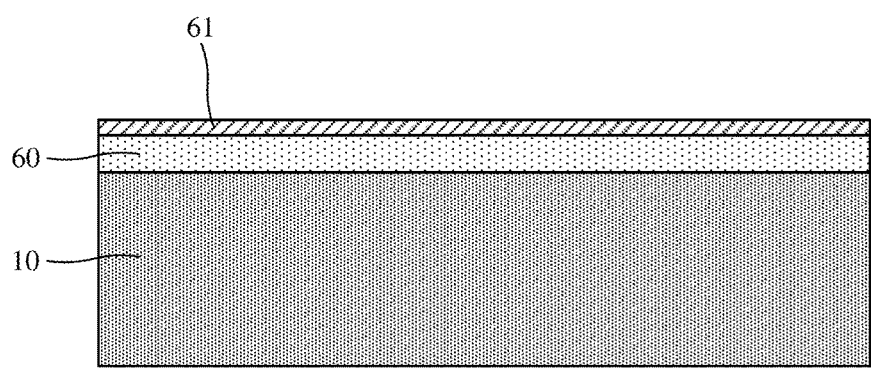

FIG. 4B illustrates a cross-sectional view of the substrate after forming a passivation layer over the device region in accordance with embodiments of the present invention.

Referring to FIG. 4B, an optional passivation layer 61 is formed over the device region 60. The passivation layer 61 may protect the device region 60 from further processing of the substrate 10. In various embodiments, the passivation layer 61 includes a polymer material such as a plastic, an epoxy resin, an elastomer, and others. In one embodiment, the passivation layer 61 is a thick oxide layer.

Figure 4C:
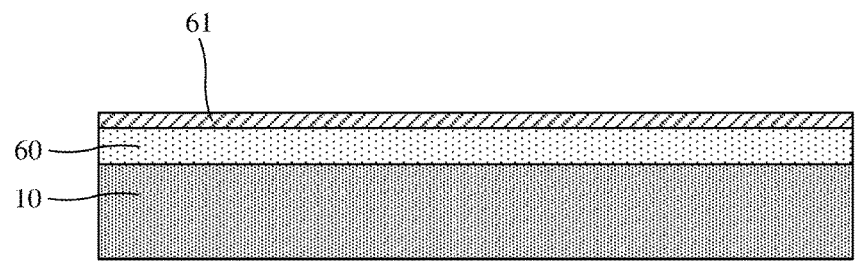

FIG. 4C illustrates a cross-sectional view of the substrate after thinning the substrate in accordance with embodiments of the present invention.

Referring to FIG. 4C, the thickness of the substrate 10 is reduced by a thinning process. The thinning process may be a chemical mechanical polishing (CMP) process, a mechanical grinding process, or an etching process in various embodiments. Etching processes may include a wet etch or a dry etch and may be isotropic or anisotropic. In some embodiments, the thinning process may be omitted.

Figure 4D:
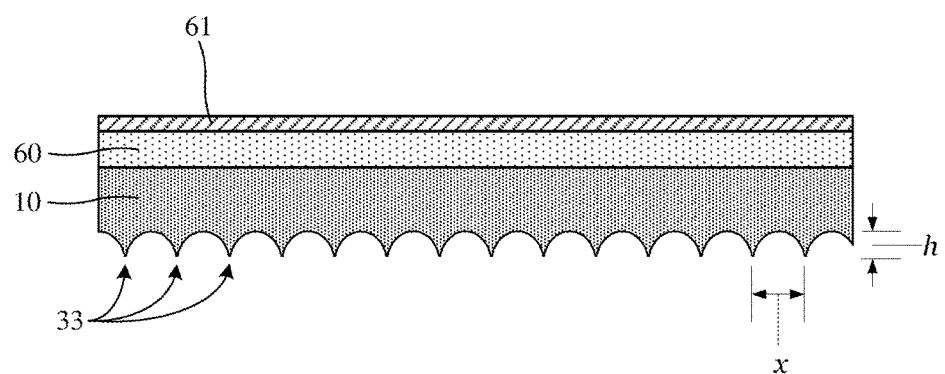

FIG. 4D illustrates a cross-sectional view of the substrate after etching the substrate to form a rough surface of the substrate with sharp features in accordance with embodiments of the present invention.

Referring to FIG. 4D, the substrate 10 is etched using a roughening etch process to produce a rough surface of the substrate 10. The rough surface may also include sharp features 33 due to the etch process. The sharp features 33 may be formed from gas bubbles within the etchant solution, for example. The sharp features 33 may include peaks and valleys in the rough surface of the substrate 10. In various embodiments, the average height h of the sharp features 33 on the rough surface of the substrate 10 is between 200 nm and 2000 nm, and about 325 nm to about 425 nm in one embodiment. In various embodiments, the average distance between the sharp features x is between 500 nm and 2 µm, and about 800 nm to about 1200 nm in one embodiment. The rough surface of the substrate 10 may facilitate strong adhesion, good ohmic contact, and good thermal contact to subsequent material layers formed on the substrate 10. In various embodiments, the roughening etch process also accomplishes the thinning process described in reference to FIG. 4C and therefore does not constitute a separate process step.

In various embodiments, the roughening etch process is a wet etch and an isotropic wet etch in some embodiments. The roughening etch process may be performed as a spin etch or immersion etch for example. During a spin etch, the etchant may be introduced onto a spinning substrate 10. The spinning substrate 10 generates forces that carry the etchant and etched material away from the substrate 10 to prevent re-adsorption of the etched material onto the substrate 10. Following the spin etch, the spinning substrate 10 may be cleaned using a solvent to further removed particles and dried with a stream of inert gas. In various embodiments, the solvent is water ($H_2O$). In one embodiment, the substrate 10 is rinsed prior to and following the conclusion of the spin etch.

By comparison, during an immersion etch, the substrate 10 is fully or partially immersed in etchant solution bath. During the immersion etch, the etchant solution may be heated or agitated using ultrasonication techniques, for example. After the immersion etch is complete, the substrate 10 is removed from the etchant solution bath and immersed in a solvent bath or rinsed with a solvent to remove particles.

The roughening etch may include hydrofluoric acid (HF), nitric acid ($HNO_3$), acetic acid ($CH_3COOH$), sulfuric acid ($H_2SO_4$), phosphoric acid ($H_3PO_4$), ammonium hydroxide ($NH_4OH$), hydrogen peroxide ($H_2O_2$), water ($H_2O$), and others. In one embodiment, the roughening etch includes HF, $HNO_3$, $CH_3COOH$, and $H_2O$ and is an HNA etch. In another embodiment, the roughening etch includes HF, $HNO_3$, and $H_2SO_4$ diluted in $H_2O$. In one or more embodiments, etching chemical may be diluted to 40-50% HF, 60-70% $HNO_3$, and 90-99% $H_2SO_4$. For example, the etchants may be produced from etching chemicals that may include 49% HF, 65% $HNO_3$, and 96% $H_2SO_4$. In one embodiment, the etching chemicals of 49% HF, 65% $HNO_3$, and 96% $H_2SO_4$ may be combined in a volume ratio of about 1:1:8. Specifically, this may result in an etching solution that includes about 5% of HF, 7% of $HNO_3$, 77% of $H_2SO_4$, and 12% of $H_2O$. In various embodiments, the volume of 49% HF included in the roughening etch is between 5% and 20%. In various embodiments, the volume of 65% $HNO_3$ included in the roughening etch is between 5% and 20%. In various embodiments, the volume of 96% $H_2SO_4$ included in the roughening etch is between 70% and 90%.

The relative concentrations of etchants in solution influence the topographical profile of the rough surface of the substrate 10 and may be chosen such that a desired roughness is attained for a particular application. For example, the ratio of h to x of the features may be increased by increasing the concentration of $H_2SO_4$, or, equivalently, increasing the concentration of the diluent. Similarly, the ratio of h to x may be decreased by decreasing the concentration of $H_2SO_4$ or increasing the concentration of the diluent. The number of peaks may be increased (pitch between peaks decreased) by decreasing the concentration of the diluent.

Figure 4E:
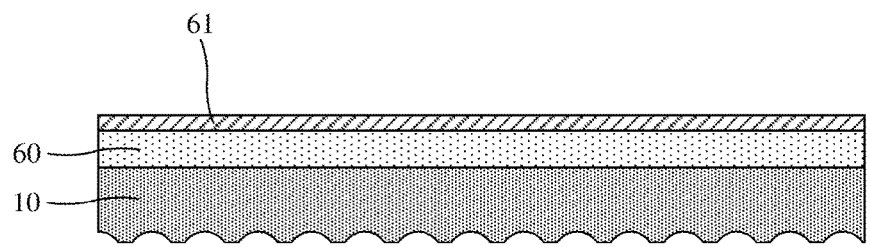

FIG. 4E illustrates a cross-sectional view of the substrate after etching the substrate to controllably smooth the rough surface of the substrate in accordance with embodiments of the present invention.

Referring to FIG. 4E, the sharp features 33 on the rough surface of the substrate 10 are smoothed using a subsequent smoothing etch. As with the roughening etch, the smoothing etch may be a spin etch, an immersion etch, or a dry etch (e.g. plasma), for example. In one embodiment, the smoothing etch is carried out in the same etching tool as the roughening etch. In this case, the etching process is stopped and remaining etchant is flushed from the system. Optionally, the substrate 10 may then be rinsed with a solvent to remove particles created during the roughening etch. Also optionally, the substrate 10 may be dried with a stream of inert gas. The etchant for the smoothing etch is then introduced to the substrate for the required amount of time. Following the smoothing etch, the substrate 10 may again be optionally rinsed with solvent and dried with a stream of inert gas. In various embodiments the solvent is water ($H_2O$). In various embodiments, the drying gas is nitrogen ($N_2$).

During the smoothing etch, the etchants in solution may nucleate at the sharp corners initiating the etching process at these locations. Process parameters for the smoothing etch are selected so as to maintain the rough surface of the substrate 10 while removing sharp features 33 that may lead to undesirable self-shadowing in a subsequent deposition of a material layer. These process parameters of the smoothing etch are different than those of the roughening etch. However, due to the material of the substrate 10 being the same in both cases, the smoothing etch may also include hydrofluoric acid (HF), nitric acid ($HNO_3$), acetic acid ($CH_3COOH$), sulfuric acid ($H_2SO_4$), phosphoric acid ($H_3PO_4$), ammonium hydroxide ($NH_4OH$), hydrogen peroxide ($H_2O_2$), water ($H_2O$), and others.

In various embodiments, the etchants and concentrations of constituent etchants for the smoothing etch are different than for the roughing etch. For example, in one embodiment, the smoothing etch includes HF, $HNO_3$, $H_2SO_4$, and $H_3PO_4$ diluted in $H_2O$. In one or more embodiments, etching chemical may be diluted to 45-55% HF, 60-70% $HNO_3$, 90-99% $H_2SO_4$, and 70-90% $H_3PO_4$. In one example, the etching chemicals may be 49% HF, 65% $HNO_3$, 96% $H_2SO_4$, and 85% $H_3PO_4$. In one embodiment, the stocked chemicals of 49% HF, 65% $HNO_3$, 96% $H_2SO_4$, and 85% $H_3PO_4$ may be combined in a volume ratio of about 1:6:1:1. Specifically, this may result in an etching solution that includes about 5% of HF, 44% of $HNO_3$, 10% of $H_2SO_4$, 10% of $H_3PO_4$, and 31% of $H_2O$ in contrast to the examples given in reference to the roughening etch process. In various embodiments, the volume of 49% HF included in the smoothing etch is between 5% and 15%. In various embodiments, the volume of 65% $HNO_3$ included in the smoothing etch is between 55% and 75%. In various embodiments, the volume of 96% $H_2SO_4$ included in the smoothing etch is between 5% and 15%. In various embodiments, the volume of 85% $H_3PO_4$ included in the smoothing etch is between 5% and 15%.

In this particular example of a smoothing etch, $H_3PO_4$ is included, the concentration of $H_2SO_4$ is decreased, and the concentrations of $HNO_3$ and diluent ($H_2O$) are increased relative to the roughening etch. Additionally, in various embodiments, the etching time for the smoothing etch is reduced when compared to the roughening etch process. In various embodiments, the etching time for the smoothing etch is less than 150 s, and between 1 s and 130 s in one embodiment. In one embodiment, the etching time is about 5 s and in another embodiment, the etching time is about 10 s.

The smoothing etch serves to round the sharp features on the substrate. In various embodiments, the average height of the smoothed sharp features is between 25 nm and 1000 nm. In one embodiment, the ratio of the height to the width of the smoothed sharp features is about 0.25. In various embodiments, the ratio of height to width of the smoothed sharp features is between 0.2 and 0.5. The smoothed sharp features are spaced from one another by a pitch. In one embodiment, ratio of the width to the pitch of the smoothed sharp features is about 0.75. In various embodiments, the ratio of the width to the pitch of the smoothed sharp features is between 0.5 and 1.

Figure 4F:
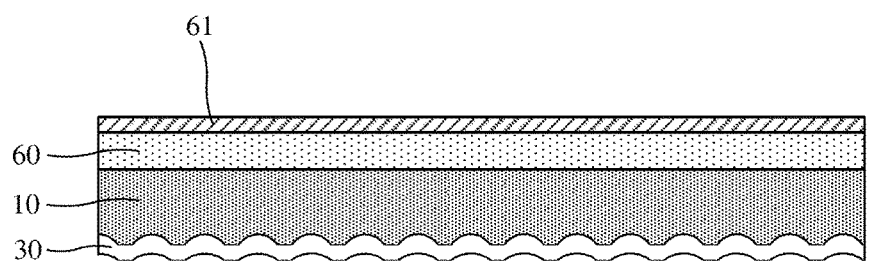

FIG. 4F illustrates a cross-sectional view of the substrate after forming an adhesion layer over the rough surface of the substrate in accordance with embodiments of the present invention.

Referring to FIG. 4F, an adhesion layer 30 is formed over the rough surface of the substrate 10. The adhesion layer 30 comprises materials as previously described in reference to FIGS. 1-3. The adhesion layer 30 may be formed using a deposition process such as sputtering, vapor deposition, printing, electroplating, and electroless plating, for example. In one embodiment, the adhesion layer 30 is formed using a sputtering technique. In various embodiments, the thickness of the adhesion layer 30 may be between 50 nm to 500 nm and is about 200 nm in one embodiment.

Figure 4G:
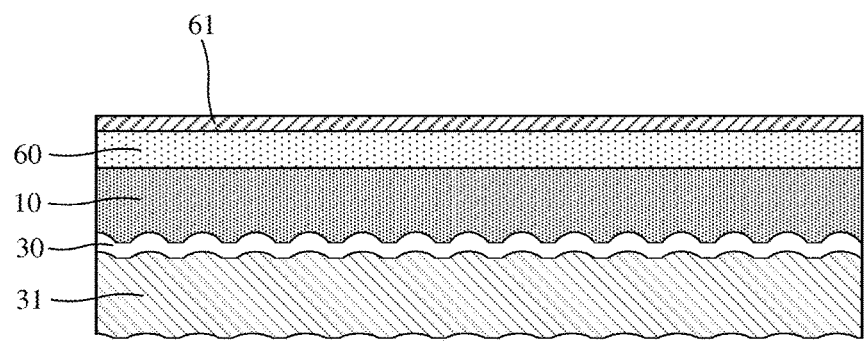

FIG. 4G illustrates a cross-sectional view of the substrate after forming a thick material layer over the adhesion layer in accordance with embodiments of the present invention.

Referring to FIG. 4G, a thick material layer 31 is formed over the adhesion layer 30 or the substrate 10 if the adhesion layer 30 is omitted. The thick material layer 31 comprises materials as previously described. The thick material layer 31 may be formed using a deposition process such as those described previously. In various embodiments, the thickness of the thick material layer 31 is between 500 nm and 2 μm. In one embodiment, the thickness of the thick material layer 31 is 1 μm. In various embodiments, the thickness of the thick material layer 31 is between 1% and 300% of the thickness of the substrate 10. In one embodiment, the ratio of the thickness of the thick material layer 31 to the thickness of the substrate 10 is about 1:150. In another embodiment, this ratio is about 1:5, and in still another embodiment, this ratio is about 1:1.

In various embodiments, the thick material layer 31 exerts stress on the substrate 10. If the stress exerted on the substrate 10 is not properly compensated, it can cause warping and cracking. A substantially rough substrate such as that attained in the present method may work to counteract the stress to the substrate 10 and other layers caused by the thick material layer 31.

Figure 4H:
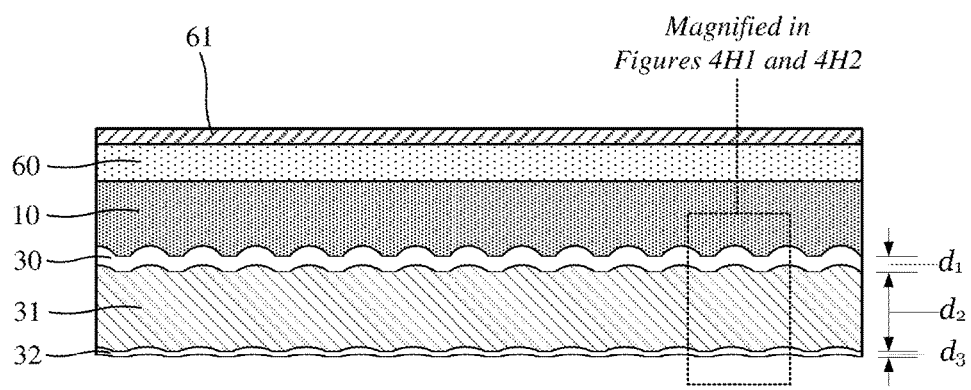

FIG. 4H illustrates a cross-sectional view of the substrate after forming a thin material layer over the thick material layer in accordance with embodiments of the present invention.

Referring to FIG. 4H, a thin material layer 32 is formed over the thick material layer 31. The thin material layer 32 comprises materials as previously described. The thin material layer 32 may be formed using a deposition process such as those described previously. In various embodiments, the thin material layer 32 is between 100 nm and 500 nm. In one embodiment, the thickness of the thin material layer 32 is about 200 nm. The average thicknesses of the adhesion layer 30, thick material layer 31, and thin material layer 32 are illustrated in FIG. 4H as $d_1$, $d_2$, and $d_3$ respectively. In one embodiment, the ratio $d_1:d_2:d_3$ is about 1:5:1. In an alternative embodiment, the ratio $d_1:d_2:d_3$ is about 2:5:2.

Subsequent processing may continue as in conventional semiconductor processing. For example, if needed the passivation layer 61 is removed or patterned to expose front side contacts, and the substrate 10 is diced to form individual dies. The structure may be further encapsulated and packaged with appropriate known techniques.

FIGS. 4H1 and 4H2 illustrate a magnified region of the substrate as indicated by the box in FIG. 4H. In FIG. 4H1, the sharp features 33 remain on the substrate 10. Subsequent formation of an adhesion layer 30 and a thick material layer 31 may cause significant differences in thickness of the thick material layer 31 as can be seen by the dimensions $d_4$ and $d_5$. In some cases, the ratio of $d_4$ to $d_5$ may be 1:2. For example, the thickness of the thick material layer $d_4$ may be about 500 nm and the thickness $d_5$ may be about 1000 nm. Physical deposition methods may result in self shadowing in the presence of sharp features on the substrate 10. FIG. 4H1 shows example trajectories of particles being deposited during deposition of the thick material layer 31. The incident flux of particles is much lower in the valleys between the sharp features because only particles with trajectories about normal to the substrate 10 may reach the surface. This may result in local thinning of the thick material layer 31 (as well subsequent layers such as the thin material layer 32) and may further form undesirable exposed regions of the thick material layer 31 as illustrated in FIG. 4H1.

By contrast, FIG. 4H2 is a magnified portion of a substrate after sharp features have been rounded using a smoothing etch according to embodiments of the present invention. The thickness of the thick material layer 31 in between the rounded features is about the same as the thickness above the rounded features. This is shown with the dimension $d_6$ in FIG. 4H2. A benefit of a more uniform thick material layer 31 is that the thin material layer does not suffer from local thinning or self-shadowing as in FIG. 4H1.

Figure 5A:
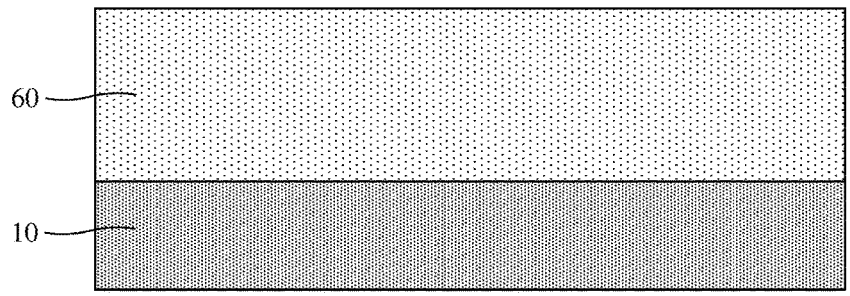
Figure 5B:
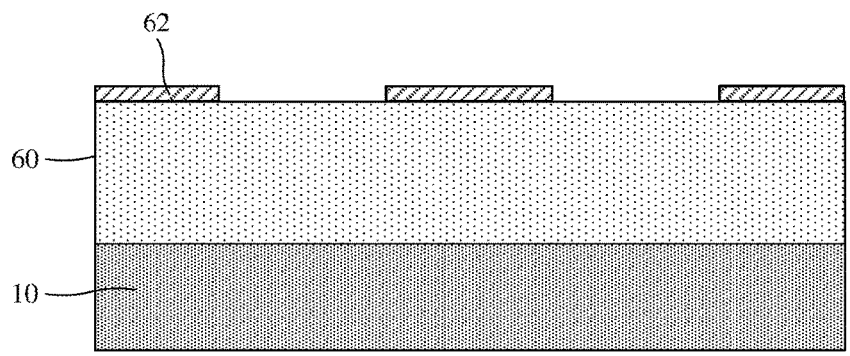
Figure 5C:
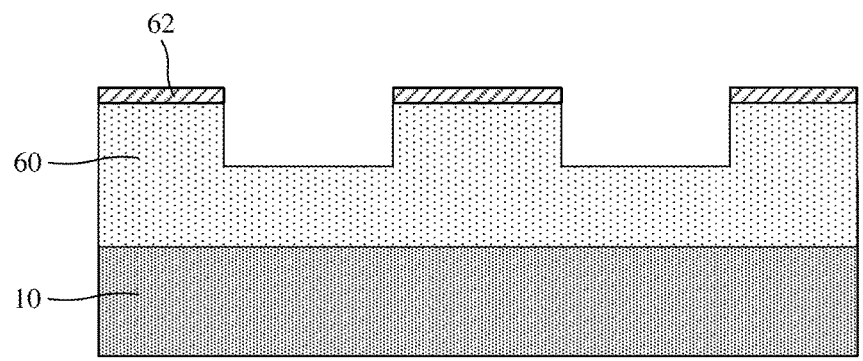
Figure 5D:
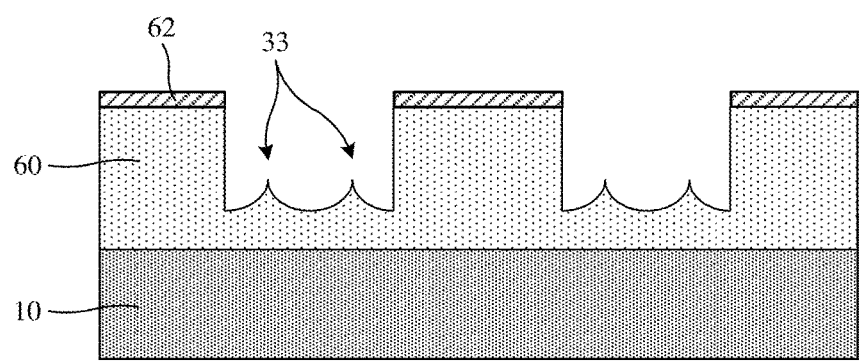
Figure 5E:
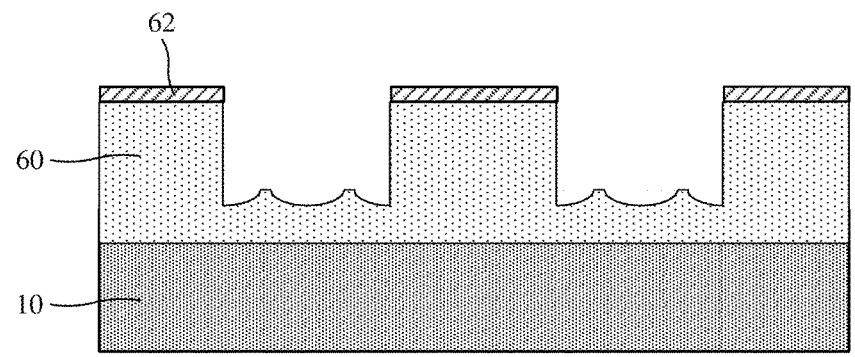
Figure 5F:
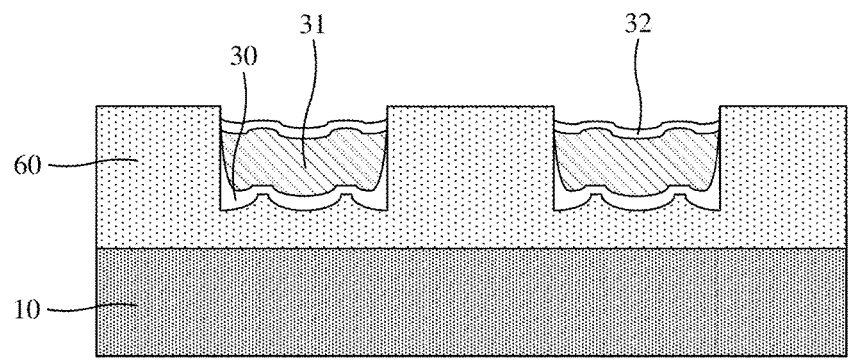
Figure 5G:
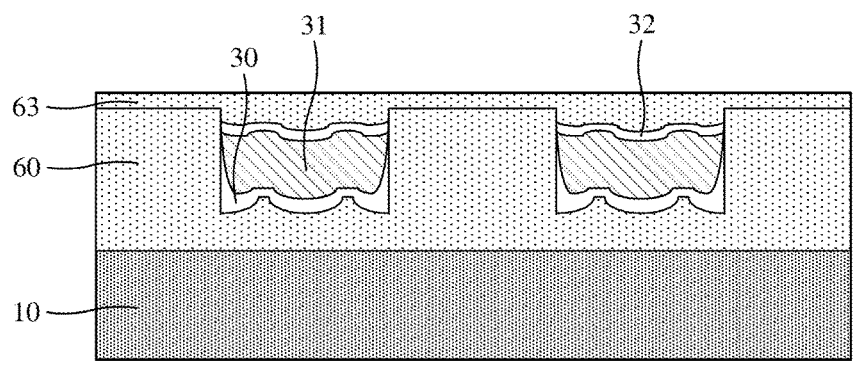

FIGS. 5A-5G illustrate an embodiment of forming buried structures on a substrate comprising one or more recessed regions each comprising a rough surface and a material layer formed over the rough surface in accordance with an embodiment of the present invention, where FIG. 5A illustrates a cross-sectional view of a substrate after forming a device region over the substrate, FIG. 5B illustrates a cross-sectional view of the substrate after forming a mask over select areas of the device region, FIG. 5C illustrates a cross-sectional view of the substrate after forming one or more recessed regions in the device region, FIG. 5D illustrates a cross-sectional view of the substrate after etching surfaces of the recessed regions to form rough surfaces with sharp features, FIG. 5E illustrates a cross-sectional view of the substrate after etching the surfaces to controllably smooth the rough surfaces of the recessed regions, FIG. 5F illustrates a cross-sectional view of the substrate after forming adhesion layers, thick materials layers, and thin material layers over the rough surfaces of the recessed regions, and FIG. 5G illustrates a cross-sectional view of the substrate after forming a capping layer over the thin material layer of each recessed region and the device region.

Referring to FIG. 5A, a device region 60 is formed over a substrate 10. The device region 60 may include active and/or passive devices, doped regions, contacts, passivation layers, and metallization layers as previously described. As illustrated in FIG. 5B, a mask region 62 is formed over the device region 60. The mask region 62 may be a hard mask in one example. Optionally, the mask region 62 may also protect surfaces of the device region 60 from a subsequent etching step that forms rough surfaces with sharp features 33 on surfaces of the recessed regions.

Referring to FIG. 5C, one or more recessed regions are then formed in the device region 60. The recessed regions may be formed using an etching technique such as reactive ion etching (RIE), for example. Alternatively, the recessed regions may be formed using a laser ablation technique, laser thermal annealing, or a focused ion beam milling technique.

The device illustrated in FIG. 5D is after a roughening etch step as previously described. In various embodiments, all surfaces of the recessed regions are made rough using the etching step. In other embodiments, only the bottom surface of the recessed regions is made rough. In the absence of the mask region 62, other regions in addition to the recessed regions may be etched by the etching step. The rough surfaces and sharp features 33 on the surfaces of the recessed regions are as previously described.

As next illustrated in FIG. 5E, the sharp features 33 on the rough surfaces on the surfaces of the recessed regions are then smoothed using an etching step. The smoothing etch is as previously described and may prevent or reduce self-shadowing in subsequent material layers formed in the recessed regions.

Referring to FIG. 5F, an adhesion layer 30, thick material layer 31, and thin material layer 32 are formed in the recessed regions over the rough surfaces. In some embodiments, one or all of these layers may extend beyond the recessed regions. In other embodiments, one or more of the adhesion layer 30, thick material layer 31, and thin material layer 32 are confined to the recessed regions. The possible materials and methods of formation of the adhesion layer 30, thick material layer 31, and thin material layer 32 are as previously described. Although the adhesion layer 30, thick material layer 31, and thin material layer 32 are shown to be deposited only on the bottom surface, in various embodiments, a thinner layer may be deposited along the sidewalls, for example, as also shown in the embodiment of FIG. 6.

Referring to FIG. 5G, a capping layer 63 is formed over the device region 60 and the thin material layer 32. The capping layer 63 may form buried contacts comprising the adhesion layer 30, thick material layer 31 and thin material layer 32 in the device region 60. In such embodiments, the thin material layer 32 may be a barrier to diffusion between the thick material layer 31 and the capping layer 63.

In various embodiments, the capping layer 63 may comprise a similar material to the passivation layer 62 as previously described in reference to FIG. 4. In still other embodiments, the capping layer 63 may comprise a metal or other conductive material.

Figure 6A:
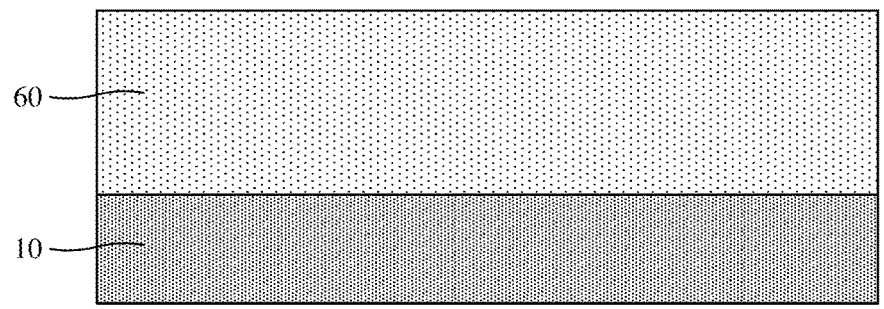
Figure 6B:
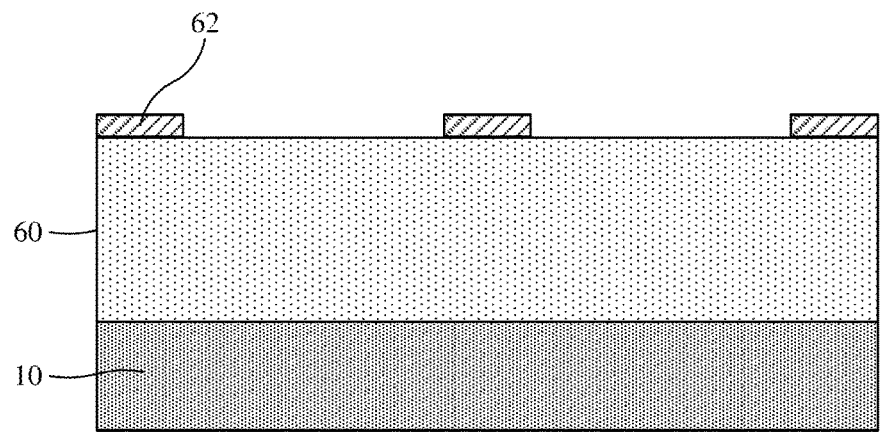
Figure 6C:
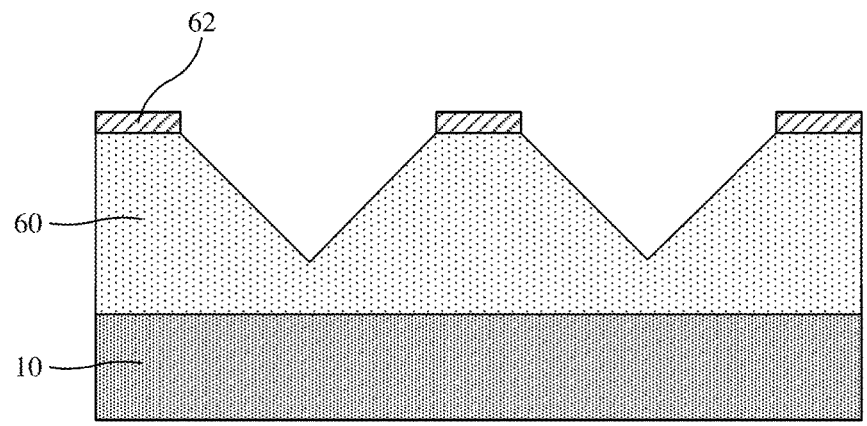
Figure 6D:
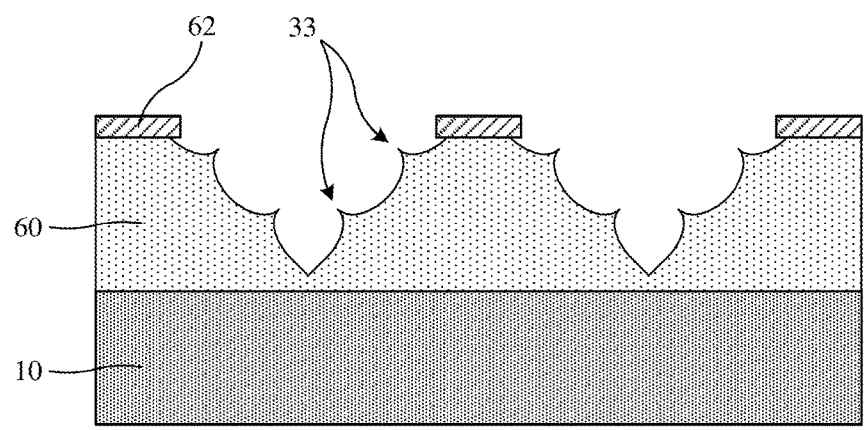
Figure 6E:
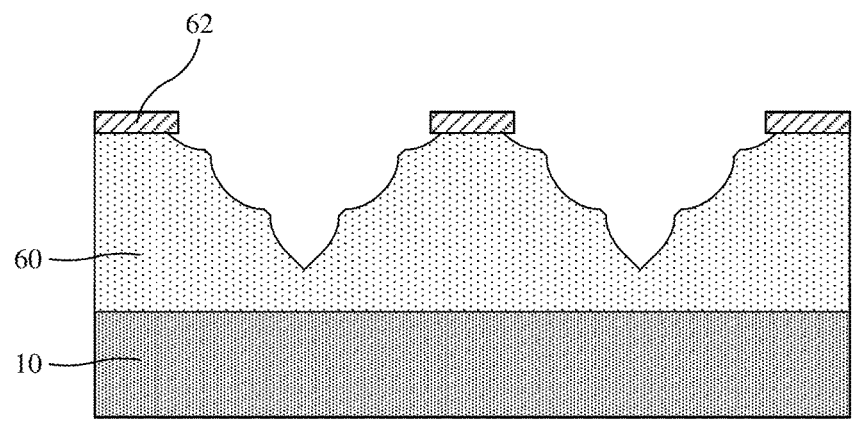
Figure 6F:
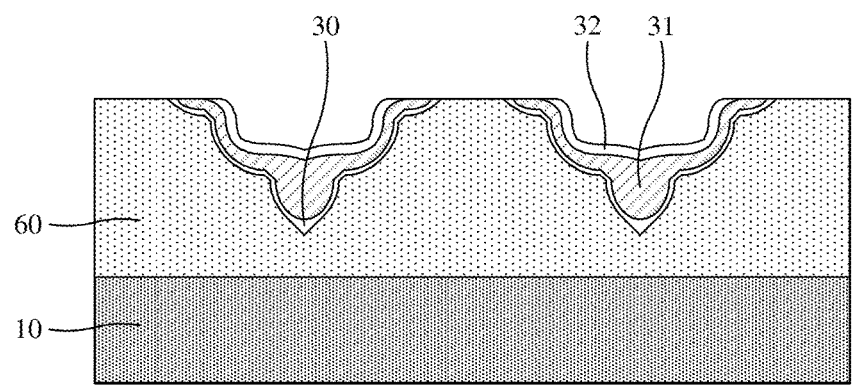

FIGS. 6A-6F illustrate an embodiment of forming recessed structures on a substrate comprising one or more recessed regions each comprising rough surfaces and a material layer formed over the rough surfaces in accordance with an embodiment of the present invention, where FIG. 6A illustrates a cross-sectional view of a substrate after forming a device region over the substrate, FIG. 6B a cross-sectional view of the substrate after forming a mask over select areas in the device region, FIG. 6C illustrates a cross-sectional view of the substrate after forming one or more recessed regions in the device region, illustrates FIG. 6D illustrates a cross-sectional view of the substrate after etching surfaces of the recessed regions to form rough surfaces with sharp features, FIG. 6E illustrates a cross-sectional view of the substrate after etching surfaces to controllably smooth the rough surfaces of the recessed regions, and FIG. 6F illustrates a cross-sectional view of the substrate after forming adhesion layers, thick material layers, and thin material layers over the rough surfaces of the recessed regions.

Referring to FIGS. 6A, a device region 60 is formed over a substrate 10. The device region 60 may include active and/or passive devices, doped regions, contacts, passivation layers, and metallization layers as previously described. As illustrated in FIG. 6B, a mask region 62 is then formed over the device region 60 as previously described. One or more recessed regions are then formed (FIG. 6C) in the device region 60 as previously described in reference to FIG. 5B. In one embodiment, the recessed regions have a v-shaped cross-section.

Referring to FIG. 6D, a roughening etch step is used to form sharp features 33 on the surfaces of the recessed regions. As previously described, as shown in FIG. 6E, a subsequent smoothing etch is then used to remove the sharp features 33 from the recessed regions while maintaining rough surfaces.

Referring to FIG. 6F, an adhesion layer 30, thick material layer 31, and thin material layer 32 are formed in the recessed regions over the rough surfaces. In various embodiments, the adhesion layer 30, thick material layer 31, and thin material layer 32 form trench contacts. In one embodiment, the trench contacts have a v-shaped cross-section.

The above embodiments described in reference to FIGS. 5 and 6 may be used, for example, in the devices illustrated in FIGS. 1-3. Possible applications include the formation of gate, source, and drain contacts and the formation of interconnects, among others.

Uniformity of layer thickness and height are important for the predictability, performance, reliability, and longevity of semiconductor devices. Thus, improved semiconductor processing techniques are needed to produce uniform thin material layers over thick material layers that have been formed on a rough substrate. As described in various embodiments of the present invention, good adhesion and low contact resistance is achieved by using a smoothed rough surface.

Embodiments of the present invention improve upon the methods of forming material layers on a rough substrate and reduce and/or eliminate the detrimental effects of self-shadowing of a thick material layer during the formation of a subsequent thin material layer through the novel processing methods described herein.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-6 may be combined with each other in alternative embodiments. It is therefore intended that the appended claims encompass any such modifications or embodiments.

What is claimed is:

1. A method of fabricating a semiconductor device, the method comprising:
   using a first etching process, etching a first surface of a semiconductor substrate from a first side to expose a second surface comprising a plurality of sharp features, the second surface being a first rough surface, wherein an average height of the plurality of sharp features measured from the global minimum of the first rough surface is a first height;
   using a second etching process, etching the second surface of the semiconductor substrate from the first side to expose a third surface of the semiconductor substrate, wherein the second etching process converts the plurality of sharp features into a plurality of rounded features, the third surface being a second rough surface, wherein an average height of the plurality of rounded features measured from the global minimum of the second rough surface is a second height, and wherein the second height is less than the first height; and
   forming a conductive layer over the third surface of the semiconductor substrate using a physical deposition process.

2. The method of claim 1, wherein an average lateral distance between adjacent features of the plurality of sharp features is a first distance, wherein an average lateral distance between adjacent features of the plurality of rounded features is a second distance, and wherein the first distance is less than the second distance.

3. The method of claim 1, wherein forming the conductive layer comprises:
   forming a metal adhesion layer over the third surface of the semiconductor substrate;
   forming a thick metallization layer over the metal adhesion layer; and
   forming a thin metallization layer over the thick metallization layer.

4. The method of claim 3, wherein a vertical thickness of the thin metallization layer is between 100 nm and 500 nm, and wherein a vertical thickness of the thick metallization layer is between 500 nm and 5 μm.

5. The method of claim 1, wherein the first height is between 200 nm and 2000 nm, and wherein the second height is between 25 nm and 1000 nm.

6. The method of claim 1, further comprising forming a device region on a second side of the semiconductor substrate.

7. The method of claim 1, wherein the first surface is an entire major surface of the semiconductor substrate.

8. The method of claim 1, further comprising:
   forming a device region over a first side of the semiconductor substrate;
   before etching the first surface of the semiconductor substrate, forming a recessed region in the device region, the recessed region comprising the first surface; and
   forming a mask region over a portion of the device region to expose the first surface.

9. A method of fabricating a semiconductor device, the method comprising:
   using a first etching process in an etching tool, etching an entire major surface of a semiconductor substrate from a first side to expose a first rough surface of the semiconductor substrate, wherein the first etching process comprises a diluent and a first set of etchants including sulfuric acid in a first concentration by volume;

using a second etching process in the etching tool, etching the first rough surface of the semiconductor substrate from the first side to expose a second rough surface of the semiconductor substrate, wherein the second etching process comprises phosphoric acid, the diluent, and the first set of etchants including sulfuric acid in a second concentration by volume, the first concentration being greater than the second concentration; and forming a conductive layer over the third surface of the semiconductor substrate using a physical deposition process.

10. The method of claim 9, wherein the second etching process is an isotropic wet etch.

11. The method of claim 10, wherein the first etching process has a first set of etchant concentrations comprising 1%-10% of hydrofluoric acid, 5%-10% of nitric acid, and 70%-80% of sulfuric acid by volume, and wherein the second etching process has a second set of etchant concentrations comprising 1%-10% of hydrofluoric acid, 40%-50% of nitric acid, 5%-15% of sulfuric acid, and 5-15% of phosphoric acid by volume.

12. The method of claim 10, wherein the first etching process has a first set of etchant concentrations comprising about 5% of hydrofluoric acid, about 7% of nitric acid, about 77% of sulfuric acid, and the remainder of a diluent by volume, and wherein the second etching process has a second set of etchant concentrations comprising about 5% of hydrofluoric acid, about 44% of nitric acid, about 10% of sulfuric acid, about 10% of phosphoric acid, and the remainder of the diluent by volume.

13. The method of claim 9, wherein forming the conductive layer comprises:
    forming a metal adhesion layer over the third surface of the semiconductor substrate;
    forming a thick metallization layer over the metal adhesion layer; and
    forming a thin metallization layer over the thick metallization layer.

14. The method of claim 13, wherein a vertical thickness of the thin metallization layer is between 100 nm and 500 nm, and wherein a vertical thickness of the thick metallization layer is between 500 nm and 5 µm.

15. The method of claim 9, wherein the first etching process comprises a first set of etchant concentrations and a first etching time, wherein the second etching process comprises a second set of etchant concentrations and a second etching time, and wherein the second etching time is different than the first etching time.

16. The method of claim 15, wherein the second etching time is between 1 s and 130 s.

17. A method of fabricating a semiconductor device, the method comprising:
    using a first etching process, etching a first surface of a semiconductor substrate from a first side to expose a second surface comprising a plurality of sharp features to form a rough surface of the semiconductor substrate,
    wherein, after the first etching process, the semiconductor substrate comprises both a first minimum thickness and a first maximum thickness, and
        wherein a ratio of the first maximum thickness to the first minimum thickness is a first ratio;
    using a second etching process, smoothing the plurality of sharp features to form a plurality of rounded features while maintaining the rough surface of the semiconductor substrate,
        wherein the second etching process exposes a third surface of the semiconductor substrate,
        wherein, after the second etching process, the semiconductor substrate comprises both a second minimum thickness and a second maximum thickness,
        wherein a ratio of the second maximum thickness to the second minimum thickness is a second ratio, and
        wherein the second ratio is less than the first ratio; and
    forming a conductive layer over the third surface of the semiconductor substrate using a physical deposition process.

18. The method of claim 17, wherein the first ratio is about 2:1 and the second ratio is about 1:1.

19. The method of claim 17, wherein forming the conductive layer comprises:
    forming a metal adhesion layer over the third surface of the semiconductor substrate;
    forming a thick metallization layer over the metal adhesion layer; and
    forming a thin metallization layer over the thick metallization layer.

20. The method of claim 19, wherein the thin metallization layer comprises a third minimum thickness and a third maximum thickness, and wherein a ratio of the third maximum thickness to the third minimum thickness is about 1:1.

21. The method of claim 19, wherein a vertical thickness of the thin metallization layer is between 100 nm and 500 nm, and wherein a vertical thickness of the thick metallization layer is between 500 nm and 5 µm.

22. The method of claim 17, further comprising forming a device region on a second side of the semiconductor substrate.

23. The method of claim 17, wherein the first surface is an entire major surface of the semiconductor substrate.

24. The method of claim 9, wherein the first concentration is at least four times the second concentration.

* * * * *